United States Patent
Piper et al.

[11] Patent Number: 5,900,587
[45] Date of Patent: May 4, 1999

[54] DAISY CHAIN CABLE ASSEMBLY AND METHOD FOR MANUFACTURE

[76] Inventors: Douglas E. Piper, 21 Buckingham Rd., Greenville, S.C. 29607; Sam S. Shasteen, 321 Piedmont Park Rd., Greenville, S.C. 29609; David C. Howard, 118 Ginger Ln., Taylors, S.C. 29687; Clifford L. DeYoung, 1136 Cooper Bridge Rd., Woodruff, S.C. 29388; Marvella A. Dickerson, 218 Bethany Rd., Simpsonville, S.C. 29681; William J. Ricket, 218 Baldwin Cir., Mauldin, S.C. 29662

[21] Appl. No.: 08/768,706

[22] Filed: Dec. 18, 1996

Related U.S. Application Data

[63] Continuation of application No. 08/348,791, Dec. 2, 1994, abandoned.

[51] Int. Cl.$^6$ ........................................................ H01B 7/08
[52] U.S. Cl. ................................. 174/117 F; 174/117 M
[58] Field of Search ........................... 174/117 F, 117 FF, 174/117 M, 251, 260, 268, 36; 29/857, 860; 439/492, 496, 497, 498

[56] References Cited

U.S. PATENT DOCUMENTS

| | | | |
|---|---|---|---|
| 4,005,921 | 2/1977 | Hadden et al. | 439/497 X |
| 4,143,236 | 3/1979 | Ross et al. | 174/32 X |
| 4,234,759 | 11/1980 | Harlow | 174/104 X |
| 4,406,915 | 9/1983 | Lang | 174/117 F |
| 4,423,282 | 12/1983 | Suzuki et al. | 174/36 |
| 4,527,135 | 7/1985 | Piper | 333/5 X |
| 4,602,316 | 7/1986 | Feick | 174/117 F X |
| 4,635,359 | 1/1987 | Nozick | 29/878 X |
| 4,644,092 | 2/1987 | Gentry | 174/117 FF X |
| 5,051,544 | 9/1991 | Harris | 174/117 F |
| 5,195,908 | 3/1993 | Yamamoto et al. | 439/422 |
| 5,220,133 | 6/1993 | Sutherland et al. | 174/120 R X |
| 5,363,549 | 11/1994 | Hecker | 29/742 X |
| 5,371,324 | 12/1994 | Kanno et al. | 174/117 F |

*Primary Examiner*—Kristine Kincaid
*Assistant Examiner*—Chau N. Nguyen
*Attorney, Agent, or Firm*—Cort Flint; Henry S. Jaudon

[57] ABSTRACT

A method and apparatus are disclosed in which a continuous elongated length of multi-conductor flat ribbon cable having a plurality of continuous signal and ground conductors for serially interconnects a plurality of terminal connectors. The signal and ground conductors include signal and ground wires which are disposed along the length of the cable in a predetermined arrangement with insulation material covering the wires. The insulation material is removed at predetermined positions along the length of the cable exposing the signal and ground wires for attachment to the terminal connectors.

21 Claims, 6 Drawing Sheets

DAISY CHAIN CABLE ASSEMBLY AND METHOD FOR MANUFACTURE

This application is a continuation of application Ser. No. 08/348,791 filed on Dec. 2, 1994, now abandoned.

BACKGROUND OF THE INVENTION

This invention relates to a daisy chain electrical cable assembly, and more particularly, to a continuous elongated length of multi-conductor woven cable having a plurality of continuous signal and ground conductor wires which are terminated at a plurality of locations along the length of the cable.

In the computer industry, computer cables interconnect various components of the computer such as the hard drive, mother board, and other electrical components. In the current technology known as small computers system interface (SCSI) multiple hard drives are utilized within the system. Accordingly, it is necessary to provide electrical signals to each of these hard drives within the small computer system interface. Generally, the hard drives are interconnected with individual cables and utilize input and output connections at each hard drive for connecting the cables. Such a system is inconvenient to use and expensive to manufacture.

Accordingly, it is an object of the present invention to provide a daisy chain cable assembly which is easy to manufacture;

Also, it is an object of the present invention to provide a continuous daisy chain cable assembly for integrating the multiple electrical components of a small computer system interface;

Also, it is an object of the present invention to provide a continuous daisy chain cable assembly having serially interconnected connectors;

Furthermore, it is an object of the present invention to provide a method for creating a daisy chain cable assembly having serially interconnected connectors.

SUMMARY OF THE INVENTION

The above objectives are accomplished according to the present invention by a method and apparatus in which a continuous elongated length of multi-conductor flat ribbon cable having a plurality of continuous signal and ground conductors serially interconnect a plurality of terminal connectors for transmitting electrical signals. The signal and ground conductors include signal and ground wires which are disposed along the length of the cable in a predetermined arrangement with insulation material covering the wires. The insulation material is removed at predetermined positions along the length of the cable exposing the signal and ground wires for attachment to the terminal connectors.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
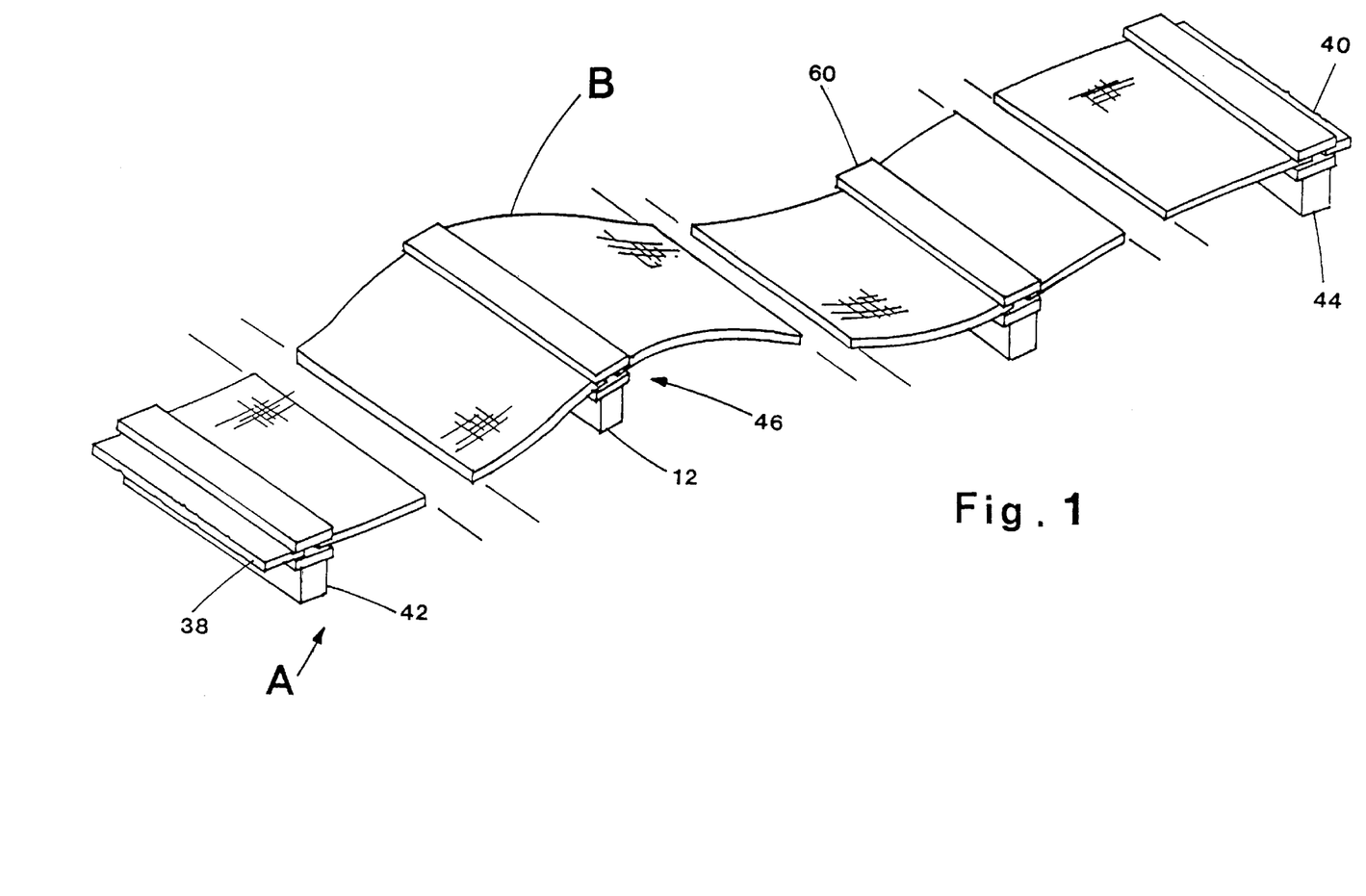
FIG. 1 illustrates a continuous daisy chain cable assembly which is shown partitioned to reflect that the cable may be of any length according to the invention.

Referring now in more detail to the drawings, the invention will now be described in more detail. FIG. 1 illustrates a daisy chain electrical cable assembly A including a continuous flat ribbon cable B having a plurality of longitudinal conductors 10 extending continuously along the length of cable B and a plurality of serially interconnected terminal connectors 12 connected to conductors 10 along the length of cable B for transmitting electrical signals.

Flat ribbon cable B may be either a laminated cable or a woven cable having weft yarns only or warp and weft yarns. In the preferred embodiment, flat ribbon cable B is a woven controlled balanced transmission line as disclosed in U.S. Pat. No. 4,527,135 which is incorporated by reference into this application. Conductors 10 include signal conductors S and ground conductors G. Shown in FIG. 2, the signal conductors S are arranged in balance signal wire pairs 20, 22, and 24. These balance conductor pair consist of a first signal conductor 20a, 22a, and 24a, and a second associated signal conductor 20b, 22b, and 24b. The first and second signal wires in each pair are disposed in generally parallel vertical planes in a generally side-by-side manner. The vertical displacement between the two signal wires may be varied to provide a desired spacing and impede its value.

Figure 2:
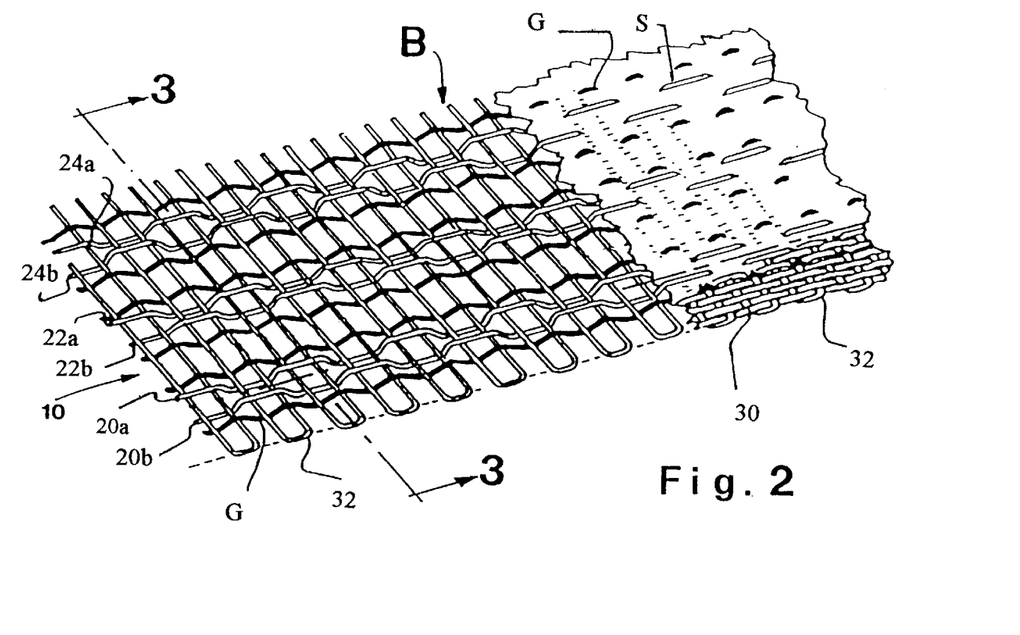
FIG. 2 is a partial perspective view of a woven cable constructed with parts of the woven fabric omitted for purposes of clarity.

There is a ground conductor G on each side of each signal conductor wire pair. This may be provided by either a single ground wire between each pair or double ground wires between each pair, as illustrated.

In the woven construction of the cable, a plurality of warp yarns 30 and weft yarns 32, are interwoven in a suitable pattern with the signal conductors S and ground conductors G to fix their configuration in the cable such that the spacing of the conductors is precisely fixed. The signal conductor S of each pair illustrated is being woven in an undulating pattern wherein the undulations are 180 degrees out of phase.

The phase shift of the undulations, and thus the vertical displacement of the signal conductors in each pair may be varied with respect to each other as desired by a desired impedance value. With the undulations 180 degrees out of phase, a maximum relative displacement and impedance will be provided for the cable for a given lateral spacing of the conductors and signal density of the cable. The undulations may be woven less out of phase to lower the impeding value as desired.

Figure 3:
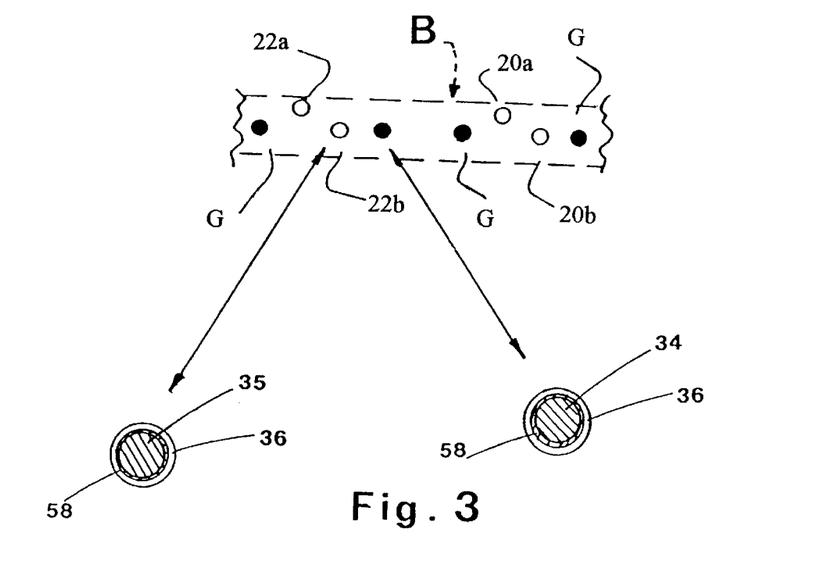
FIG. 3 is an enlarged view of the signal and ground conductors of the woven cable.

As shown in FIG. 3, signal conductors S each respectively include a signal core conductive wire 34 with a surrounding layer of insulation 36 and ground conductors G each respectively include a ground conductive wire 35 surrounded by a layer of insulation 36. In the preferred embodiment, surrounding insulation 36 is of polyurethane material. In the preferred embodiment, a nylon jacket normally surrounds the polyurethane insulation of each wire to prevent abrasion, and the cable also includes a polyurethane coating sprayed over the cable to give it stability and further fix the geometric configuration of the conductors in the woven pattern. Warp yarns 30 and weft yarns 32 also act to insulate cable B.

As shown in FIG. 1, cable B has a first end 38 and a second end 40. A first terminal connector 42 is disposed near first end 38 in electrical communication with the signal and ground core conductive wires. A second terminal connector 44 is disposed near second end 40 in electrical communication with the signal and ground core conductive wires.

Figure 4:
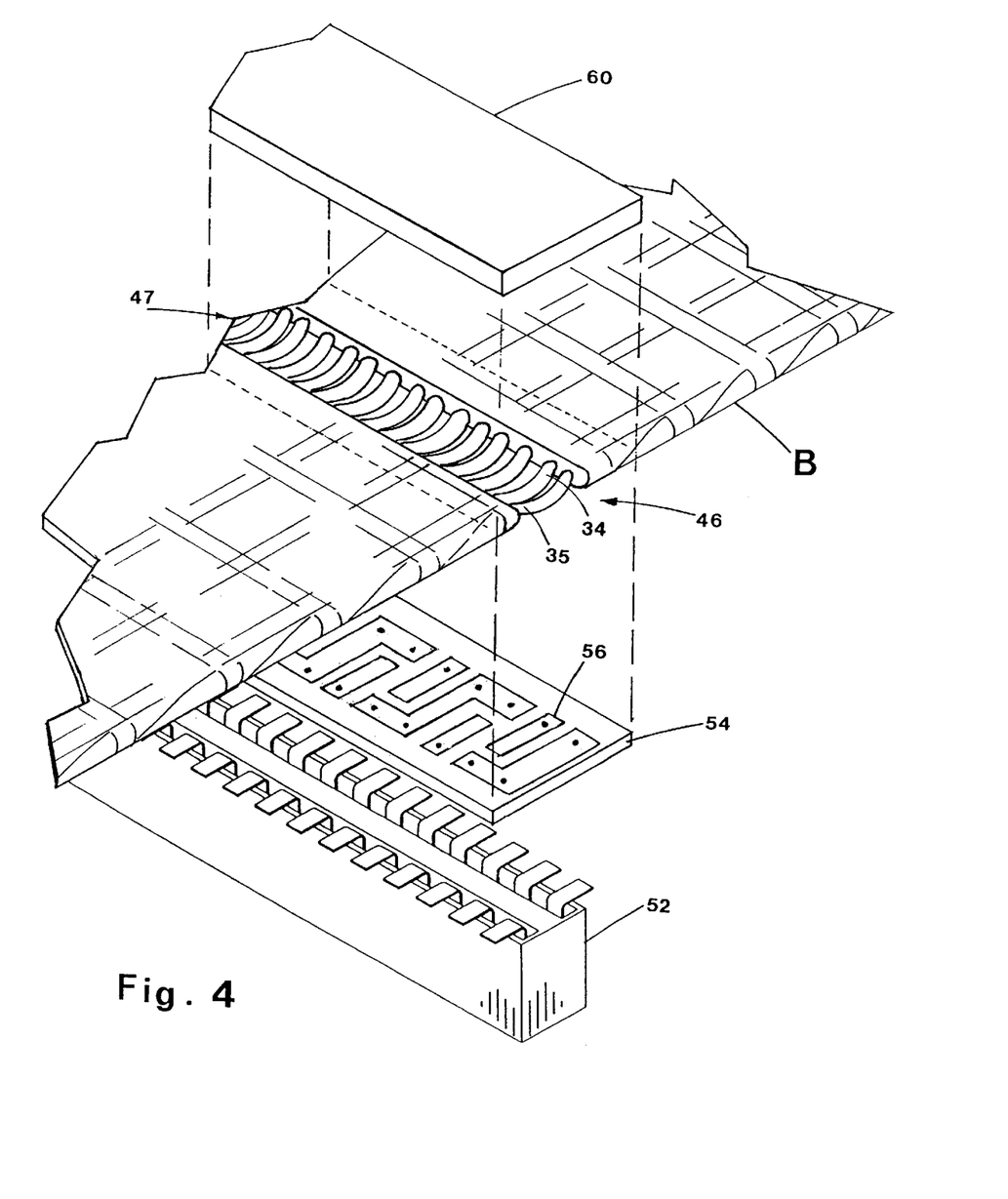
FIG. 4 illustrates an exploded view of the signal and ground wires in position for attachment to a printed circuit board and a strain relief according to the invention.

As shown in FIGS. 1 and 4, cable B has a first termination area 46 intermediate said first and second terminal connectors where said continuous signal and ground core conductive wires 34 and 35 are devoid of insulation layer 36 exposing the wires to define an exposed continuous wire segment 47. As shown in FIG. 4, a third terminal connector 52 is connected in electrical communication to exposed core conductive wires 34 and 35.

As shown in FIG. 4, signal and ground core conductive wires 34, 35 are exposed in side-by-side arrangement as exposed continuous wire segment 47 and traverse termination area 46 in preparation for connection to third terminal connector 52. Signal and ground conductive wires define a generally horizontal wire plane along the length of said cable. Continous wire segment 47 has a concave profile extending below said wire plane providing a surface area for connection to printed circuit board 54. Printed circuit board 54 includes electrical circuits 56 having contact points spaced side-by-side in a predetermined arrangement corresponding with the predetermined side-by-side arrangement of the signal and ground core conductive wires for transferring the electrical signals which are carried along the multiconductor cable.

As shown in FIG. 1, a plurality of terminal connectors, similar to that detailed in FIG. 4, are attached to cable B along the length of cable B to define daisy chain cable assembly A. In the preferred embodiment to promote the electrical connection between signal and ground core conductive wires 34 and 35 with printed circuit board 54, printed circuit board 54 has pre-deposited solder wells utilizing SIPAD technology enabling signal and ground conductive wires to be soldered to the printed circuit board without the use of any extrinsic solder. Furthermore as shown in FIG. 3, signal and ground core conductive wires 34 and 35 are surrounded by a metallic coating 58 which is preferably silver or tin for further enhancing the electrical connection between signal and ground core conductive wires 34, 35 and printed circuit board 54 when integrated through the soldering process.

Figure 9:
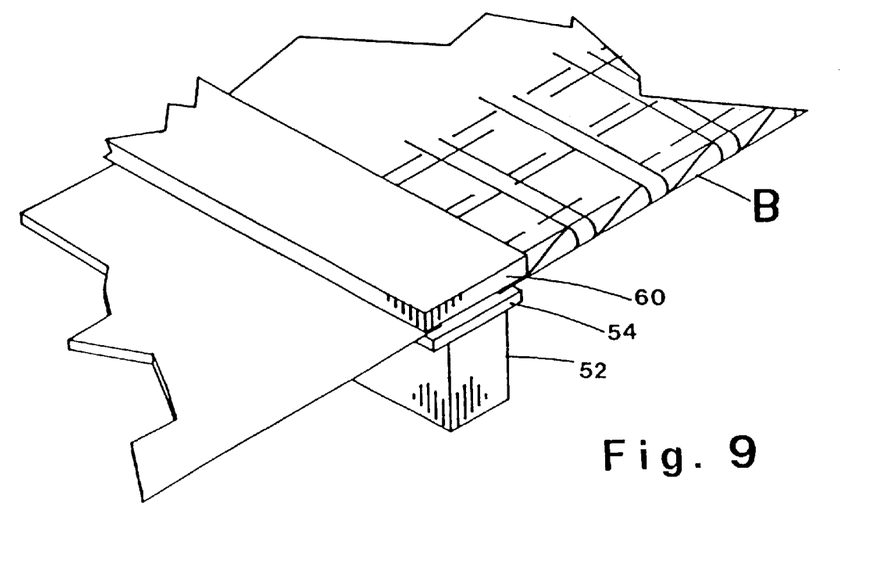
FIG. 9 illustrates the step of attaching a strain relief according to the invention.

As shown in FIGS. 1, 4 and 9, strain relief element 60 is attached to the sides of the cable insulation which borders the exposed termination area. In the preferred embodiment, printed circuit board 54 and strain relief element 60 have a surface area larger than the termination area of the cable thereby enabling strain relief element 60 to attach to the insulation material bordering the attachment area and also simultaneously attach to printed circuit board 54 thereby sandwiching the signal and ground core conductive wires between the strain relief and the printed circuit board. In this manner, pressure applied to the cable which may displace the electrical connection of the conductive core wires with the printed circuit board is resisted by strain relief element 60.

Accordingly, with this apparatus, a daisy chain cable assembly can be had which provides a continuous length of conductors along the length of the cable for serially interconnecting a plurality of terminal connectors and associated printed circuit boards.

Figure 5:
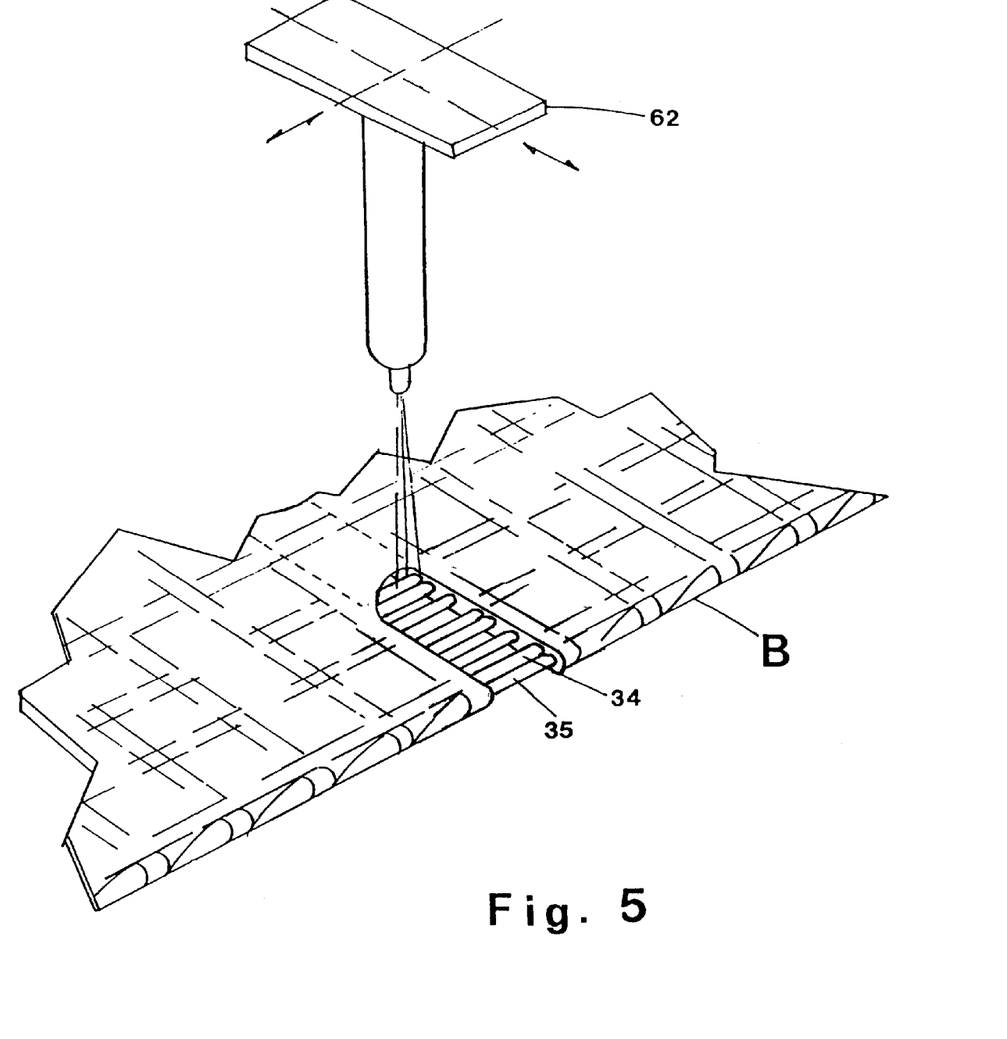
FIG. 5 illustrates a laser removing insulation from a flat ribbon cable exposing signal and ground wires according to the invention.
Figures 6, 7:
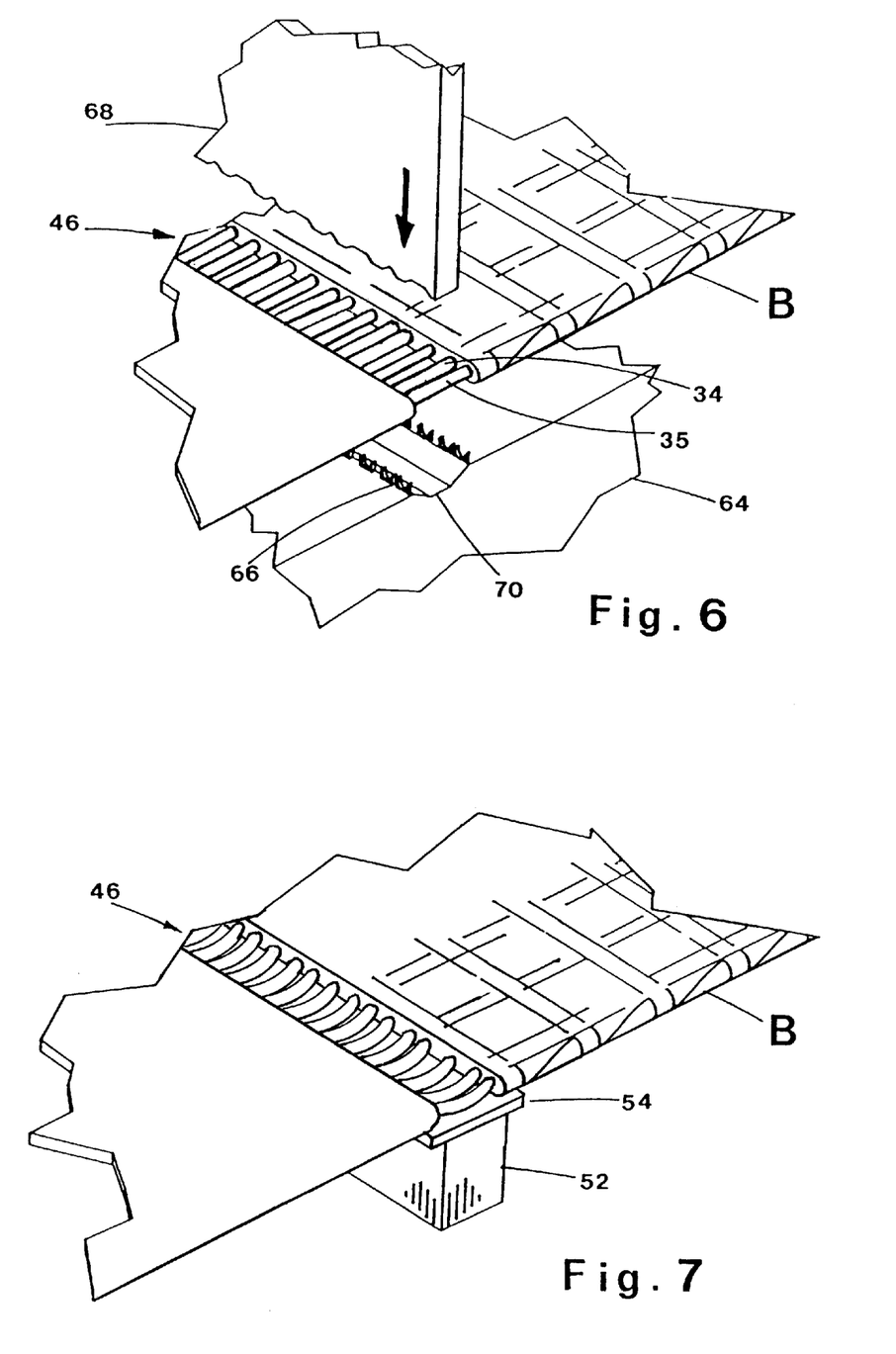
FIG. 6 illustrates a method for coining and combing the exposed signal and ground wires according to the invention.
FIG. 7 illustrates the step of attaching a connector to the exposed signal and ground wires of a cable according to the invention.

FIGS. 5 through 7 illustrate a method for producing a daisy chain cable assembly. In FIG. 5, the material surrounding the conductive wires is removed for exposing the core conductive wires 34 and 35. The surrounding material may be removed by a cutting means, an abrasive means or by a laser. In the preferred embodiment, laser 62 is utilized to remove the material surrounding the core conductive wires. In application with the woven cable, warp and weft yarns 30, 32 are made from polyester or similar low-temperature man-made fibers and the insulation surrounding the conductive wires is also made from low-temperature polyurethane. The core conductive wires 34, and 35 have a higher vaporization temperature than their surrounding material and also dissipate heat along the length of the cable. Accordingly, heat from the laser vaporizes the insulating material and the warp and weft yarns from the cable leaving the core conductive wires intact.

In the preferred embodiment, the laser is a $CO_2$ laser with alternating beams to vaporize the insulating materials as the laser beam passes over the designated area to be stripped. By utilizing low-temperature insulation and low-temperature warp and weft yarns, different wire gauges can be stripped within the same cable. Various termination areas may be etched throughout the length of cable B at predetermined designations for integrating terminal connectors with the exposed core conductive wires. By utilizing a laser, the insulation bordering the termination area is fused preventing the woven material from unraveling.

FIG. 6 illustrates the combing and coining of the exposed core conductive wires to place them in position for integration with the solder wells of the printed circuit board 54. Comb 64 having teeth 66 is utilized along with pressure applicator 68 for grooming the wires into the desired position so they may be aligned with the solder wells of the printed circuit board. The teeth of the comb place the appropriate center lines of the core conductive wires along the predetermined path for alignment with the solder wells of the printed circuit board. Depending on the flexibility of the conductive wires, it may be necessary to apply pressure to the wires to maintain them in the appropriate center line position for soldering once they have been combed. This may be done by using a mechanical comb or by applying a strengthening material such as a laminate to the wires at the area adjacent to the insulated cable away from the contact area with the printed circuit board.

Between teeth 66 is trough 70 having a generally arcuate shape for coining the exposed core conductive wires. Pressure applicator 68 depresses wires 34 and 35 into trough 70 coining wires 34 and 35 into a shape conducive for attachment to printed circuit board 54. Wires 34 and 35 are coined from there original undulating arrangement to a parallel arrangement for contact with the flat printed circuit board. Accordingly, in the preferred embodiment, the shape of the conductive wires is such that the parallel wires are disposed generally near or below the insulation of the cable providing a surface area conducive for soldering.

FIG. 7 shows the placement of the core conductive wires onto the printed circuit board for integration with the printed circuit board after the wires have been combed and coined.

Figure 8:
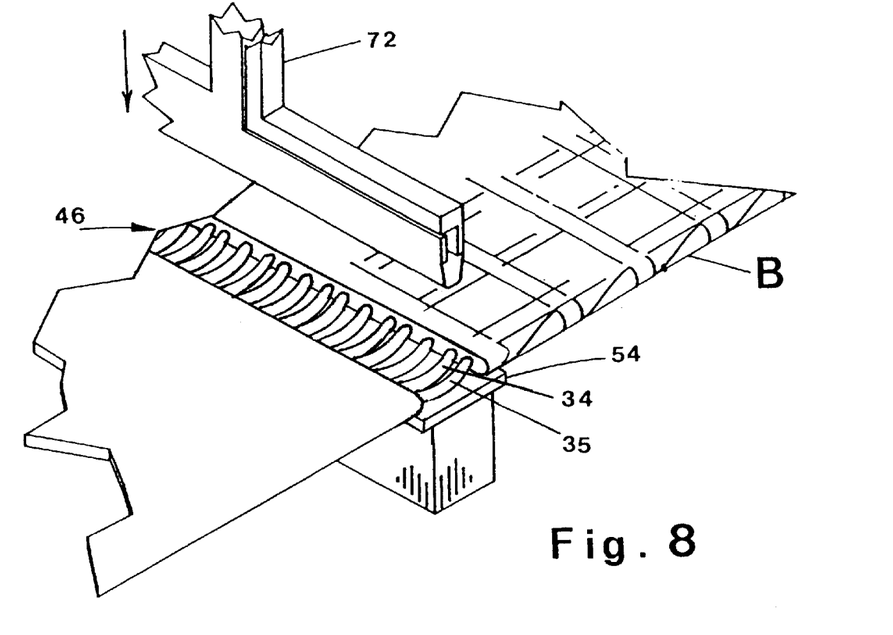
FIG. 8 illustrates the step of soldering a connector to the exposed signal and ground wires according to the invention.

FIG. 8 illustrates integration of the conductive wires with the printed circuit board. Hot bar 72 is utilized for mass soldering the wires to the predeposited soldering wells on the printed circuit board. Other soldering means may be utilized such as hot air or inert gas for non-contact soldering. Of course, each individual conductive wire may be individually soldered on to the corresponding solder well of the printed circuit board.

As shown in FIG. 9, after the core conductive wires are attached to the printed circuit board, strain relief element 60 is attached to cable B. Strain relief element 60 is of a width greater than termination area 46 and engages the woven fabric which borders termination area 46 and printed circuit board 54. Epoxy is applied to termination area 46 and onto the insulation of Cable B surrounding termination area 46 prior to the placement of the strain relief. Strain relief element 60 is attached to the woven cable and printed circuit board 54 by the epoxy. In this manner, the signal and ground conductive wires are sandwiched between the strain relief and the terminal connector. By bridging the termination area and being connected to the woven material of the cable that borders the termination area, the strain relief transfers any force along the cable across the termination area relieving any stress on the soldering connections of the conductive wires with the connector terminals.

While a preferred embodiment of the invention has been described using specific terms, such description is for illustrative purposes only, and it is to be understood that changes and variations may be made without departing from the spirit or scope of the following claims.

What is claimed is:

1. A daisy chain electrical transmission cable assembly for transmitting electrical signals comprising:
    a continuous elongated length of flat ribbon cable having a plurality of signal and ground conductive wires extending continuously along the length of said cable in a predetermined side-by-side arrangement;
    an insulation layer surrounding said signal and ground conductive wires;
    said cable having a first end and a second end, a first terminal connector disposed near said first end, said first terminal connector in electrical communication with said signal and ground conductive wires;
    a second terminal connector disposed near said second end, said second terminal connector in electrical communication with said signal and ground conductive wires;
    at least a first termination area intermediate said first and second terminal connectors where said continuous signal and ground conductive wires are devoid of said insulation layer exposing said signal and ground conductive wires in said predetermined side-by-side arrangement to define an exposed continuous wire segment;
    a third terminal connector including a printed circuit board having electrical circuits with electrical terminal lands terminating in a predetermined side-by-side arrangement corresponding with said predetermined side-by-side arrangement of said continuous signal and ground conductive wires;
    means uniting said exposed continuous signal and ground conductive wires in electrical connection with a corresponding one of said terminal lands of said printed circuit board of said third terminal connector for transmitting said electrical signals;
    said third terminal connector connected in electrical communication to said exposed continuous wire segment via said printed circuit board, wherein said signal and ground conductive wires define a generally horizontal wire plane along the length of said cable and said exposed continuous wire segment defines a concave profile below said wire plane.

2. The assembly of claim 1 wherein said continuous signal and ground conductive wires are metallically plated, said printed circuit board including solder wells and connected to said exposed continuous wire segment by solder adhering to said metallically plated signal and ground conductive wires.

3. The assembly of claim 2 wherein said continuous signal and ground conductive wires are plated with silver.

4. The assembly of claim 2 wherein said continuous signal and ground conductive wires are plated with tin.

5. The assembly of claim 1 wherein said cable includes a plurality of termination areas where said continuous conductive wires are devoid of said insulation layer exposing said signal and ground conductive wires in said predetermined side-by-side arrangement to define a plurality of exposed continuous wire segments intermediate said first and second terminal connectors for mounting a plurality of printed circuit boards having electrical circuits terminating in a predetermined side-by-side arrangement corresponding with said predetermined side-by-side arrangement of said signal and ground conductive wires.

6. The assembly of claim 1 including a strain relief attached to said cable opposite said third terminal connector, said signal and ground conductive wires sandwiched between said strain relief and said printed circuit board.

7. A daisy chain electrical transmission cable assembly for transmitting electrical signals comprising:
    a continuous elongated length of multi-conductor woven cable having a plurality of continuous signal and ground conductors extending continuously along the length of said cable in a predetermined side-by-side arrangement, said signal and ground conductors interwoven with at least insulating fiber weft strands to define a woven pattern having a substantially flat configuration wherein said arrangement of said signal and ground conductors is fixed;
    said signal and ground conductors each including a core conductive wire and a surrounding insulation layer;
    said woven cable having a first end and a second end;
    a first terminal connector disposed near said first end, said first terminal connector in electrical communication with said signal and ground conductors;
    a second terminal connector disposed near said second end, said second terminal connector in electrical communication with said signal and ground conductors;
    at least a first termination area intermediate said first and second terminal connectors wherein said cable is devoid of said fiber weft strands and said continuous signal and ground conductors are devoid of said insulation layer exposing said signal and ground conductive wires to define an exposed continuous wire segment;
    a third terminal connector for terminating said signal and ground conductors in said first termination area, said third terminal connector including a printed circuit board having electrical circuits with electrical terminal lands terminating in a predetermined side-by-side arrangement corresponding with said predetermined side-by-side arrangement of said continuous signal and ground conductors;
    means uniting said exposed continuous signal and ground conductors in electrical connection with a corresponding one of said terminal lands of said printed circuit board for transmitting electrical signals; and a strain relief attached to said cable opposite said printed circuit board, said signal and ground conductive wires sandwiched between said strain relief and said printed circuit board.

8. The assembly of claim 7 wherein said continuous signal conductors undulate relative to each other out of phase.

9. The assembly of claim 7 including warp yarns interwoven with said continuous signal and ground conductors to fix the position of said signal and ground conductors in said cable.

10. The assembly of claim 7 wherein said continuous signal and ground core conductive wires are metallically plated, said third terminal connector connected to said continuous signal and ground conductors by solder adhering to said metallically plated signal and ground core conductive wires.

11. The assembly of claim 10 wherein said continuous signal and ground core conductive wires are plated with silver.

12. The assembly of claim 10 wherein said continuous signal and ground core conductive wires are plated with tin.

13. The assembly of claim 7 wherein said cable includes a plurality of termination areas where said continuous signal and ground conductors are devoid of said insulation layer exposing said signal and ground core conductive wires to define a plurality of exposed continuous wire segments intermediate said first and second terminal connectors for mounting a plurality of printed circuit boards and terminal connectors.

14. The assembly of claim 7 wherein said signal and ground conductors define a generally horizontal wire plane along the length of said cable, said exposed continuous wire segment having a concave profile below said wire plane.

15. A method for manufacturing an electrical daisy chain cable assembly for transmitting electrical signals comprising:

providing a continuous elongated length of flat ribbon cable having first and second ends and a plurality of continuous signal and ground wires disposed along the length of said cable in a predetermined side-by-side arrangement between said first and second ends, said cable having an insulation layer surrounding said signal and ground wires, and said cable having first and second terminal connectors carried respectively by said first and second ends;

removing said insulation layer at a first predetermined termination area intermediary the first and second ends of said cable defining a continuous exposed wire segment over a length of said continuous signal and ground wires;

providing a printed circuit board having predefined circuits with electrical terminal lands corresponding to said predetermined arrangement of said continuous signal and ground wires to said exposed wire segment at said termination area;

terminating said signal and ground wires in said exposed wire segment by soldering said exposed wire segments to said terminal lands;

securing a third terminal connector electrically connectable to said printed circuit board.

16. The method of claim 15 including shaping said continuous exposed wire segment into a concave configuration providing a surface area for attaching said printed circuit board to said signal and ground wires.

17. The method of claim 15 including vaporizing said insulating layer from said termination area exposing said signal and ground wires to define said continuous exposed wire segment.

18. The method of claim 15 including removing said insulation layer at a second predetermined termination area intermediary the ends of said flat cable defining a second continuous exposed wire segment and attaching a second printed circuit board and terminal connector to said second continuous exposed wire segment at said second predetermined termination area.

19. The method of claim 15 including attaching a strain relief to said cable opposite said printed circuit board, said signal and ground wires sandwiched between said strain relief and said printed circuit board.

20. A method for manufacturing an electrical daisy chain cable assembly for transmitting electrical signals comprising:

providing a continuous elongated length of multi-conductor woven cable having a plurality of continuous signal and ground wires disposed along the length of said cable in a predetermined side-by-side arrangement, said signal and ground wires interwoven with at least insulating fiber weft strands to define a woven pattern having a substantially flat configuration;

removing said insulating fiber weft strands and an insulation layer intermediary the ends of said woven cable defining a continuous exposed wire segment over a length of said continuous signal and ground wires;

providing a printed circuit board having predefined circuits with electrical terminal lands corresponding to said predetermined arrangement of said continuous signal and ground wires to said exposed wire segment at said termination area;

terminating said signal and ground wires in said exposed wire segment by soldering said exposed wire segment to said terminal lands;

securing a terminal connector electrically connectable to said printed circuit board at said termination area.

21. The method of claim 20 including shaping said continuous exposed wire segment into a concave configuration providing a surface area for attaching said printed circuit board to said signal and ground wires.

* * * * *